(12) United States Patent
Wei

(10) Patent No.: US 7,019,239 B2
(45) Date of Patent: *Mar. 28, 2006

(54) SUSPENSION CONTROL DEVICE FOR ELECTRIC APPLIANCE

(76) Inventor: Jung-Tsung Wei, 176, Sec. 2, Tong Man Rd., Tainan (TW)

(*) Notice: Subject to any disclaimer, the term of this patent is extended or adjusted under 35 U.S.C. 154(b) by 0 days.

This patent is subject to a terminal disclaimer.

(21) Appl. No.: 11/027,451

(22) Filed: Dec. 28, 2004

(65) Prior Publication Data

US 2005/0115814 A1 Jun. 2, 2005

Related U.S. Application Data

(63) Continuation-in-part of application No. 10/613,835, filed on Jul. 1, 2003, now Pat. No. 6,875,939, which is a continuation-in-part of application No. 10/015,743, filed on Dec. 17, 2001.

(51) Int. Cl.
*H01H 3/20* (2006.01)

(52) U.S. Cl. .................................... 200/330; 200/331
(58) Field of Classification Search .............. 200/330, 200/331; 315/362; 362/96, 205, 253, 458, 362/802
See application file for complete search history.

(56) References Cited

U.S. PATENT DOCUMENTS

| 4,380,721 | A | * | 4/1983 | Bullock et al. ............. 315/362 |
| 5,166,482 | A | | 11/1992 | Li ............................. 200/52 R |
| 5,208,516 | A | | 5/1993 | Saidian ....................... 315/362 |
| 5,396,037 | A | | 3/1995 | Moore et al. ............... 200/331 |
| 5,454,056 | A | | 9/1995 | Brothers ....................... 385/16 |
| 5,532,557 | A | | 7/1996 | Saidian ....................... 315/362 |
| 5,661,370 | A | | 8/1997 | Messick ...................... 315/158 |
| 6,168,282 | B1 | * | 1/2001 | Chien ........................... 362/84 |
| 6,295,871 | B1 | | 10/2001 | Wei .............................. 73/570 |
| 6,315,431 | B1 | | 11/2001 | Greedy ........................ 362/253 |
| 6,621,026 | B1 | * | 9/2003 | Wei ............................. 200/330 |
| 6,677,546 | B1 | * | 1/2004 | Wei ............................. 200/331 |
| 6,875,939 | B1 | * | 4/2005 | Wei ............................. 200/330 |
| 2004/0065532 | A1 | | 4/2004 | Wei .......................... 200/33 C |

* cited by examiner

*Primary Examiner*—Michael A. Friedhofer
(74) *Attorney, Agent, or Firm*—Alan D. Kamrath; Nikolai & Mersereau, P.A.

(57) ABSTRACT

A suspension control device for an electric appliance includes a control circuit having a sensing circuit, and a control chain having a first end connected to the sensing circuit of the control circuit and a second end suspended in an ambient environment. Thus, the control chain functions as a sensing member. When the user's hand approaches or touches the control chain, the control circuit is operated to control operation of the electric appliance. Thus, the user can control operation of the electric appliance easily and conveniently, thereby facilitating the user operating the electric appliance.

12 Claims, 8 Drawing Sheets

SUSPENSION CONTROL DEVICE FOR ELECTRIC APPLIANCE

CROSS-REFERENCES TO RELATED APPLICATIONS

The present invention is a continuation-in-part application of U.S. Ser. No. 10/613,835, filed on Jul. 1, 2003, now U.S. Pat. No. 6,875,939, which is a continuation-in-part of U.S. Ser. No. 10/015,743, filed on Dec. 17, 2001.

BACKGROUND OF THE INVENTION

1. Field of the Invention

The present invention relates to a suspension control device and, more particularly, to a suspension control device for an electric appliance.

2. Description of the Related Art

A conventional electric appliance, such as a ceiling fan 1, in accordance with the prior art shown in FIGS. 4–8 comprises a switch 12, a motor 11 connected to and operated by the switch 12 and having a plurality of electric wires 10 connected to the switch 12, and a pull chain 13 having a first end connected to the switch 12 and a second end suspended in the ambient environment and provided with a stop 14. Thus, when the pull chain 13 is pulled downward, the switch 12 is switched to operate the motor 11 so as to control operation of the electric appliance.

In operation, the user's hand approaches and touches the pull chain 13 as shown in FIG. 5. Then, the user's hand holds the stop 14 of the pull chain 13 as shown in FIG. 6. Then, the user's hand exerts a force on the stop 14 of the pull chain 13 to pull the pull chain 13 downward as shown in FIG. 7, so that the switch 12 is switched to operate the motor 11 so as to control operation of the electric appliance. Finally, the user's hand releases the pull chain 13 as shown in FIG. 8.

However, as shown in FIG. 7, the moving direction of the pull chain 13 has to be perpendicular to the switch 12 of the electric appliance. If the moving direction of the pull chain 13 is not perpendicular to the switch 12 of the electric appliance, the switch 12 of the electric appliance cannot be switched and operated at a normal state or will be easily inoperative. Thus movement of the pull chain 13 has a directional limit, thereby causing inconvenience to the user in operation of the electric appliance. In addition, when the pulling force applied on the pull chain 13 is too large, the switch 12 of the electric appliance is easily worn out. When the pulling force applied on the pull chain 13 is too small, the switch 12 of the electric appliance is not operated, thereby causing inconvenience to the user in operation of the electric appliance. Further, the user's hand has to approach and touch the pull chain 13, then to hold the stop 14 of the pull chain 13, then to pull the pull chain 13 downward, and then to release the pull chain 13 so as to switch the switch 12 to operate the motor 11, thereby causing inconvenience to the user in operation of the electric appliance.

SUMMARY OF THE INVENTION

In accordance with the present invention, there is provided a suspension control device, comprising:

a control circuit having a sensing circuit;

a control chain having a first end connected to the sensing circuit of the control circuit and a second end suspended in an ambient environment.

The primary objective of the present invention is to provide a suspension control device that is operated by a control chain.

Another objective of the present invention is to provide a suspension control device, wherein the control chain functions as a sensing member. When the user's hand approaches or touches the control chain, the control circuit is operated to control operation of the electric appliance. Thus, the user can control operation of the electric appliance easily and conveniently, thereby facilitating the user operating the electric appliance.

A further objective of the present invention is to provide a suspension control device, wherein the user can directly operate the electric appliance without having to hold and pull the control chain, thereby saving manual work.

A further objective of the present invention is to provide a suspension control device, wherein the user only needs to approach the control chain to control operation of the electric appliance without having to hold and pull the control chain exactly and actually, thereby facilitating the user operating the electric appliance.

A further objective of the present invention is to provide a suspension control device, wherein the user only needs to approach the control chain to control operation of the electric appliance, thereby greatly simplifying the operation procedure of the electric appliance.

A further objective of the present invention is to provide a suspension control device, wherein the user needs not to touch the control chain, thereby greatly enhancing the lifetime of the suspension control device and the electric appliance.

A further objective of the present invention is to provide a suspension control device, wherein the suspension control device needs not to provide a control switch, thereby saving costs of fabrication.

A further objective of the present invention is to provide a suspension control device, wherein the suspension control device can be used to operate the electric appliance in any direction of the three-dimensional space without a directional limit, thereby enhancing the versatility of the suspension control device.

Further benefits and advantages of the present invention will become apparent after a careful reading of the detailed description with appropriate reference to the accompanying drawings.

DETAILED DESCRIPTION OF THE INVENTION

Figure 1:
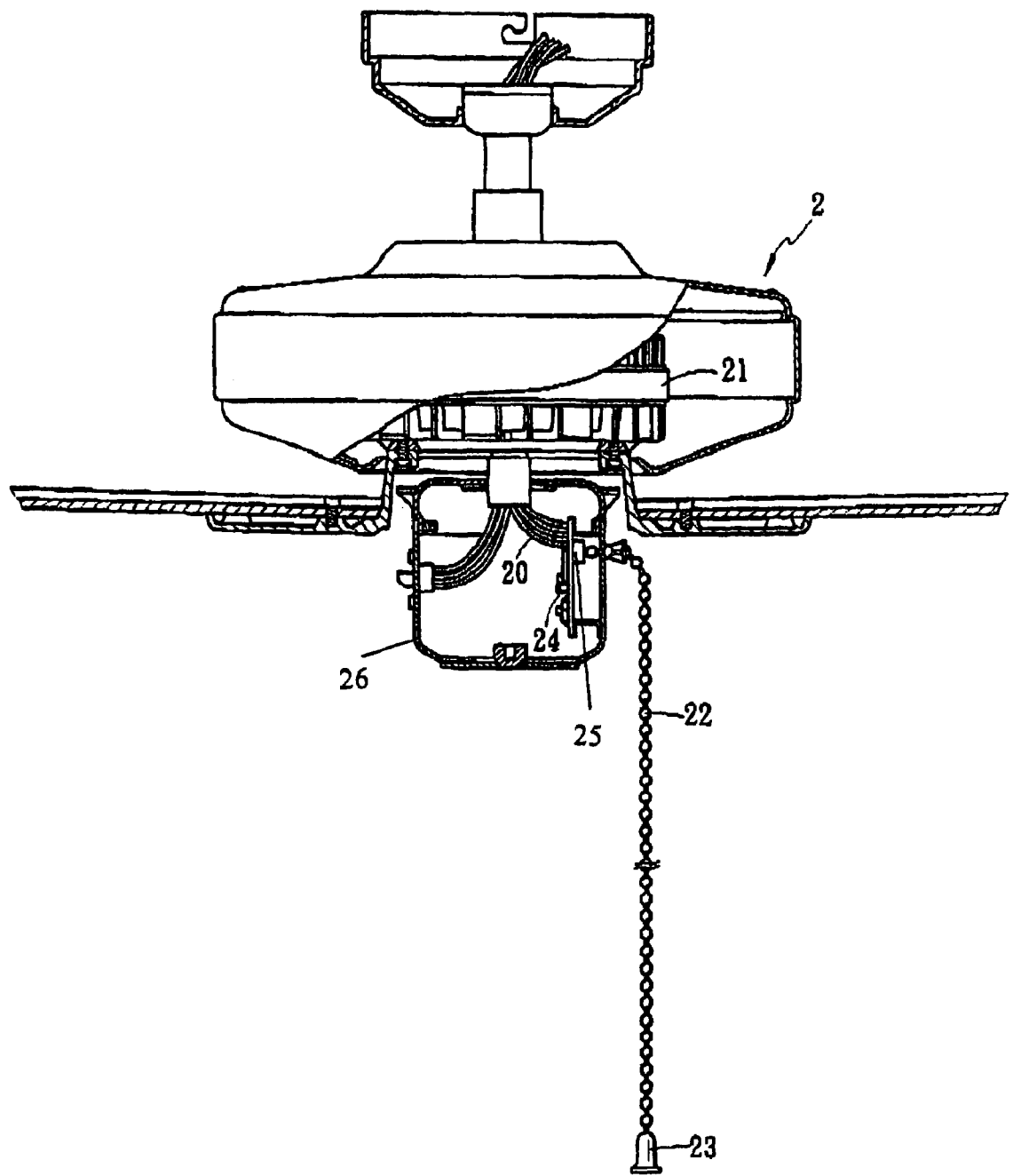
FIG. 1 is a plan cross-sectional view of a suspension control device for an electric appliance in accordance with the preferred embodiment of the present invention.
Figure 2:
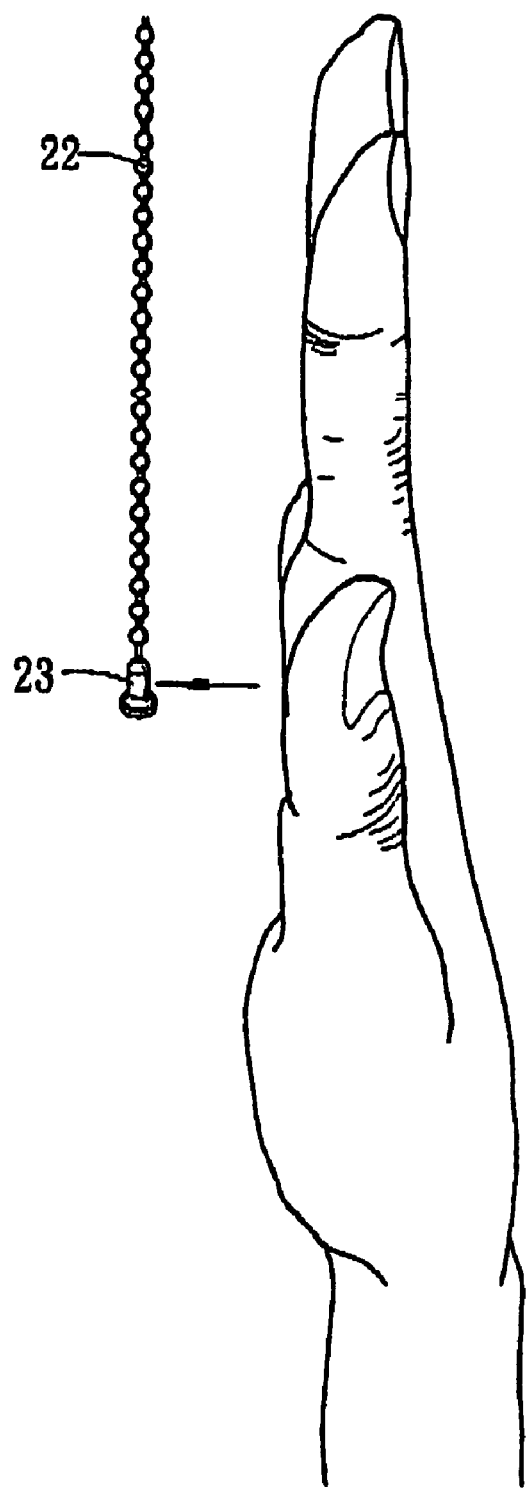
FIG. 2 is a schematic operational view of the suspension control device as shown in FIG. 1.

Referring to the drawings and initially to FIGS. 1 and 2, a suspension control device for an electric appliance in accordance with the preferred embodiment of the present invention comprises a control circuit 24 having a sensing circuit 25, and a control chain 22 having a first end connected to the sensing circuit 25 of the control circuit 24 and a second end suspended in an ambient environment.

Preferably, the electric appliance is a ceiling fan 2 including a motor 21 connected to and operated by the control circuit 24 and having a plurality of electric wires 20 connected to the control circuit 24, and a housing 26 to receive the control circuit 24.

The control chain 22 is a conductive body connected to the sensing circuit 25 of the control circuit 24, so that the control chain 22 functions as a sensing member.

The second end of the control chain 22 is suspended in the ambient environment to be touchable by a user's one hand. Preferably, the second end of the control chain 22 is provided with a weight 23, so that the control chain 22 is suspended in the ambient environment stably.

As shown in FIG. 2, when the user's hand approaches or touches the control chain 22, the sensing circuit 25 of the control circuit 24 detects a sensing signal from the control chain 22 to trigger and control the control circuit 24. Thus the control circuit 24 drives the motor 21 of the ceiling fan 2 to operate and to control operation of the ceiling fan 2.

In such a manner, when the user's hand approaches or touches the control chain 22, the control circuit 24 is operated to control operation of the ceiling fan 2.

Figure 3:
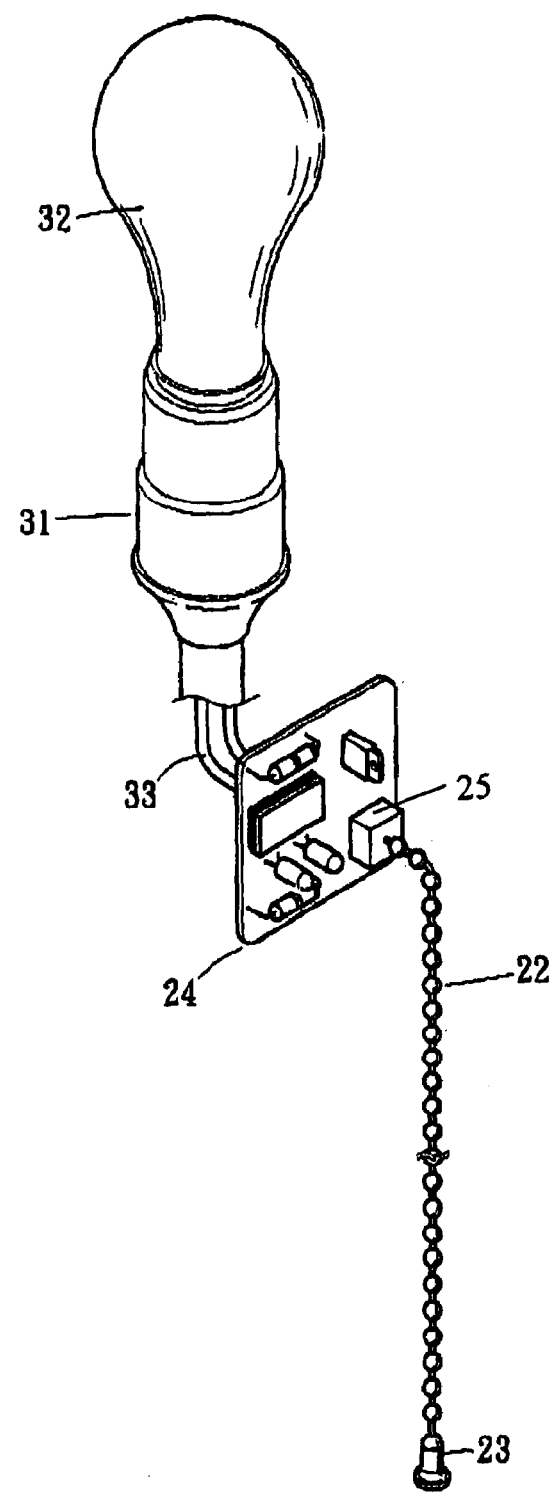
FIG. 3 is a perspective view of a suspension control device for an electric appliance in accordance with another embodiment of the present invention.
Figure 4:
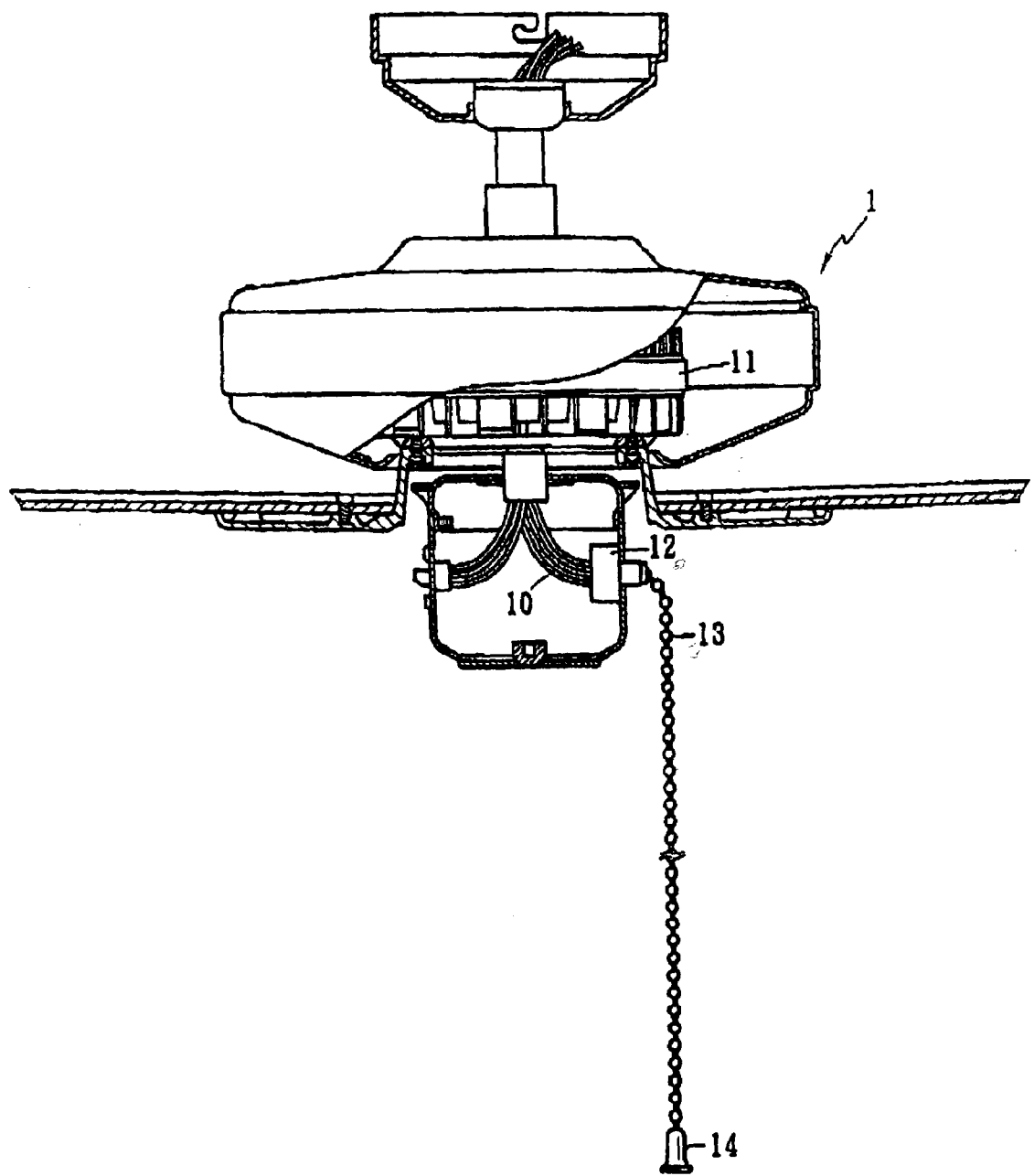
FIG. 4 is a plan cross-sectional view of a conventional electric appliance in accordance with the prior art.
Figure 5:
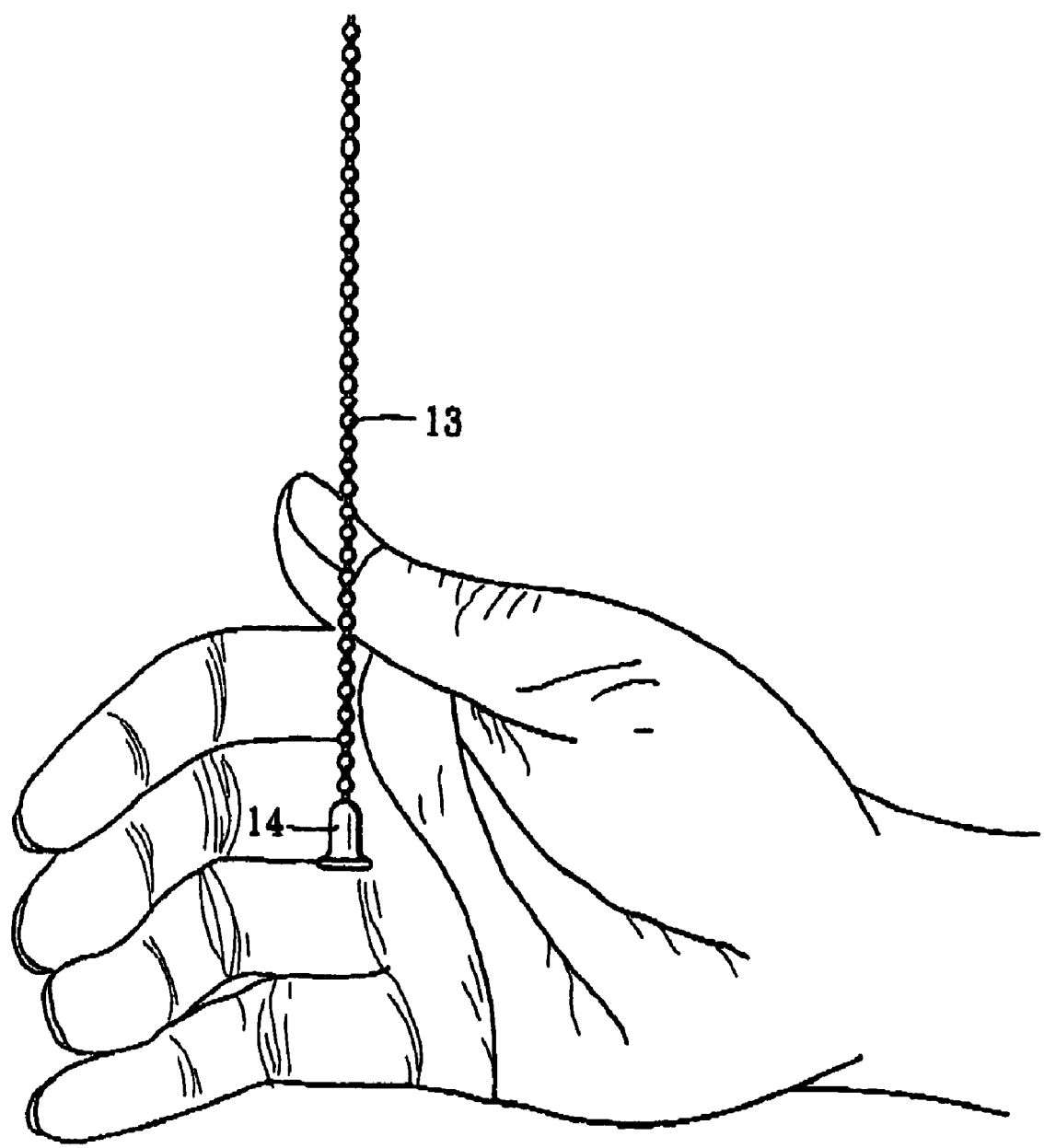
FIG. 5 is a schematic operational view of the conventional suspension control device as shown in FIG. 4.
Figure 6:
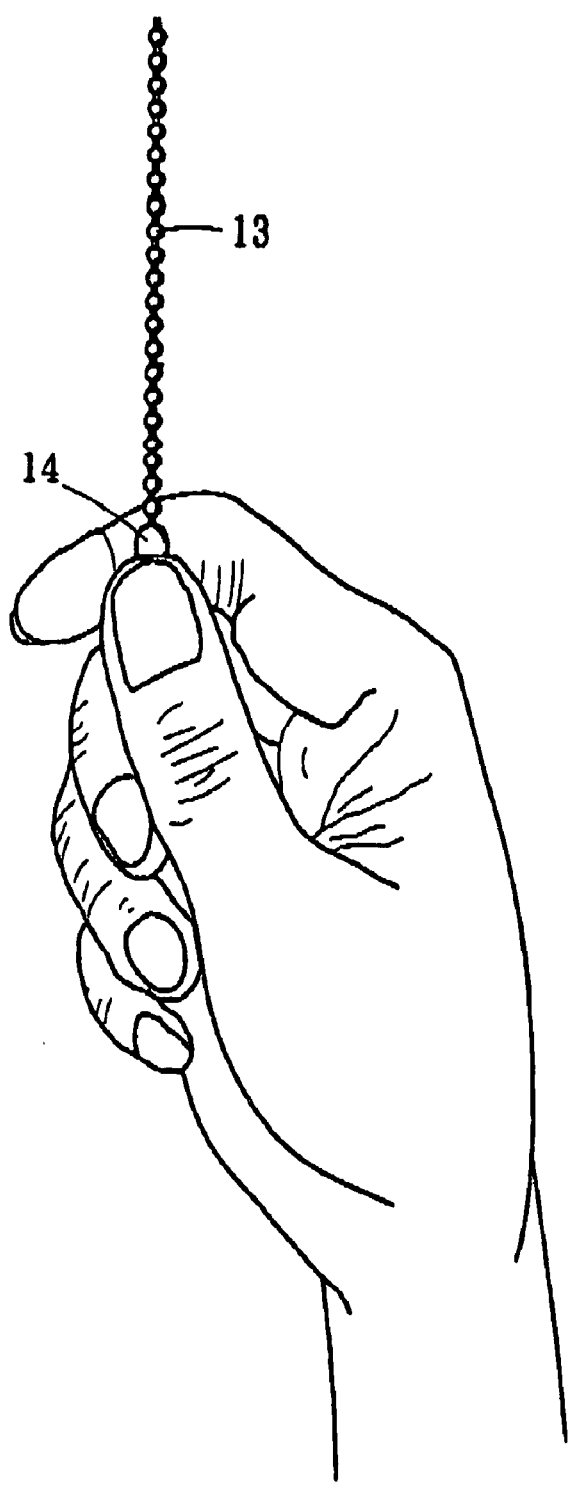
FIG. 6 is a schematic operational view of the conventional suspension control device as shown in FIG. 5.
Figure 7:
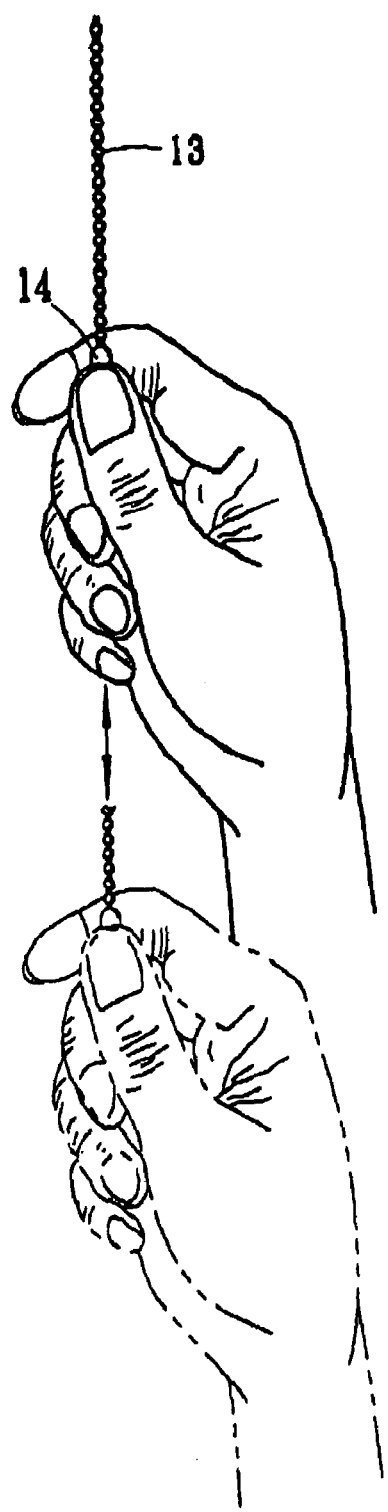
FIG. 7 is a schematic operational view of the conventional suspension control device as shown in FIG. 6.
Figure 8:
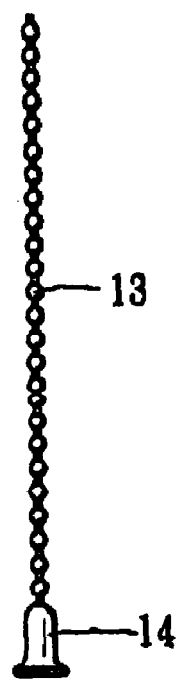
FIG. 8 is a schematic operational view of the conventional suspension control device as shown in FIG. 7.
Figure 8:
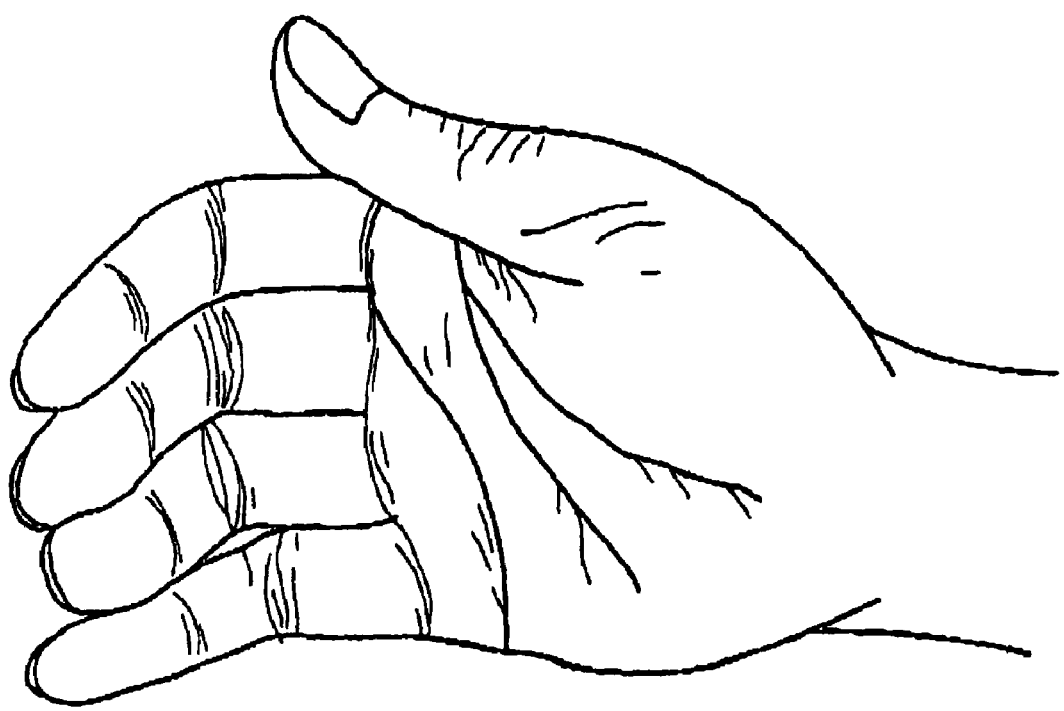

Referring to FIG. 3, the electric appliance is a lamp 31 including a bulb 32, and a plurality of electric wires 33 connected to the control circuit 24 and the bulb 32.

When the user's hand approaches or touches the control chain 22, the control circuit 24 is operated to control operation of the lamp 31.

Accordingly, the control chain 22 functions as a sensing member. Specifically, when the user's hand approaches or touches the control chain 22, the control circuit 24 is operated to control operation of the electric appliance. Thus the user can control the operation of the electric appliance easily and conveniently, thereby facilitating the user operating the electric appliance. In addition, the user can directly operate the electric appliance without having to hold and pull the control chain 22, thereby saving manual work. Further, the user only needs to approach the control chain 22 to control operation of the electric appliance without having to hold and pull the control chain 22 exactly and actually, thereby facilitating the user operating the electric appliance. Further, the user only needs to approach the control chain 22 to control operation of the electric appliance, thereby greatly simplifying the operation procedure of the electric appliance. Further, the user does not need to touch the control chain 22, thereby greatly enhancing the lifetime of the suspension control device and the electric appliance. Further, the suspension control device does not require a control switch, thereby saving costs of fabrication. Further, the suspension control device can be used to operate the electric appliance in any direction of the three-dimensional space without a directional limit, thereby enhancing the versatility of the suspension control device.

Although the invention has been explained in relation to its preferred embodiment(s) as mentioned above, it is to be understood that many other possible modifications and variations can be made without departing from the scope of the present invention. It is, therefore, contemplated that the appended claim or claims will cover such modifications and variations that fall within the true scope of the invention.

What is claimed is:

1. A suspension control device, comprising: a control circuit having a sensing circuit; a control chain having a first end connected to the sensing circuit of the control circuit and a second end suspended in an ambient environment, wherein the control chain is a conductive body connected to the sensing circuit of the control circuit, wherein the control chain functions as a sensing member.

2. The suspension control device in accordance with claim 1, wherein the second end of the control chain is suspended in the ambient environment to be touchable by a user.

3. The suspension control device in accordance with claim 1, wherein the second end of the control chain is suspended in the ambient environment to be approachable by a user.

4. The suspension control device in accordance with claim 1, wherein the second end of the control chain is provided with a weight.

5. The suspension control device in accordance with claim 1, wherein the control chain is operated in any direction of a three-dimensional space without a directional limit.

6. The suspension control device in accordance with claim 1, further comprising an electric appliance including a motor connected to and operated by the control circuit and having a plurality of electric wires connected to the control circuit, and a housing to receive the control circuit.

7. The suspension control device in accordance with claim 6, wherein when a user approaches or touches the control chain, the sensing circuit of the control circuit detects a sensing signal from the control chain to trigger the control circuit, so that the control circuit drives the motor so as to control operation of the electric appliance.

8. The suspension control device in accordance with claim 7 further comprising a plurality of blades, with the motor rotating the plurality of blades to form a ceiling fan.

9. The suspension control device in accordance with claim 6, wherein when a user approaches or touches the control chain, the sensing circuit of the control circuit detects a sensing signal from the control chain to trigger and control the control circuit.

10. The suspension control device in accordance with claim 9 further comprising a plurality of blades, with the motor rotating the plurality of blades to form a ceiling fan.

11. The suspension control device in accordance with claim 6 further comprising a plurality of blades, with the motor rotating the plurality of blades to form a ceiling fan.

12. The suspension control device in accordance with claim 1, further comprising an electric appliance including a bulb, and a plurality of electric wires connected to the control circuit and the bulb.

* * * * *